United States Patent [19]

Richter-Jörgensen

[11] Patent Number: 4,900,386

[45] Date of Patent: Feb. 13, 1990

[54] METHOD OF PRODUCING LABELS EACH HAVING A CIRCUIT FORMING AN OSCILLATING CIRCUIT

[75] Inventor: Poul Richter-Jörgensen, Almunecar, Spain

[73] Assignee: Durgo AG, Lucerne, Switzerland

[21] Appl. No.: 196,265

[22] Filed: May 20, 1988

[30] Foreign Application Priority Data

May 22, 1987 [CH] Switzerland ............... 2003/87

[51] Int. Cl.⁴ ............................................. B32B 31/16
[52] U.S. Cl. ..................................... 156/250; 156/261;
    156/267; 156/268; 156/270; 29/592.1; 340/572
[58] Field of Search ............... 156/267, 268, 270, 250,
    156/261; 333/138, 140, 175, 185; 340/572;
    29/592.1

[56] References Cited

U.S. PATENT DOCUMENTS 4,555,291 11/1985 Tait et al. ........................ 156/267
4,717,438  1/1988 Benge et al. ..................... 156/267

OTHER PUBLICATIONS

European Patent Office Search Report (Vertrag über die internationale Zusammenarbeit auf dem Gebiet des Patentwesens).

Primary Examiner—Caleb Weston
Attorney, Agent, or Firm—Laurence R. Brown; Alfred J. Mangels

[57] ABSTRACT

In order to produce labels incorporating electrical oscillating circuits, certain parts of the circuits are initially punched out of a center area of a metal web covered by an adhesive. Thereafter the center area is covered by an insulating material web for handling stability in order to thereafter punch out the part of the circuit to be located at the outer web area. A covering foil is laminated onto the metal web and the parts of the circuits to be located at the reverse side are applied onto the insulating material web and connected electrically to the remainder of the circuit. This allows an economical and yet precise mass production of labels, for instance for a use in article safeguarding and controlling systems.

13 Claims, 3 Drawing Sheets

METHOD OF PRODUCING LABELS EACH HAVING A CIRCUIT FORMING AN OSCILLATING CIRCUIT

BACKGROUND OF THE INVENTION

1. Field of the Invention

The present invention relates to a method of producing a plurality of labels located consecutively on a web. Each label includes a respective circuit of an inductive and at least one capacitive element, thus forming an oscillatory circuit, and including further an insulating support on one side of which said inductive element formed of flat electrical conductors and the one surface of said capacitive element connected thereto are located in accordance with a predetermined pattern. The counter surface of said capacitive element is located at the reverse side of said insulating support and is electrically connected to the electrical circuit at the front side. The invention relates further to labels produced in accordance with above method. The invention relates also to a controlling and safeguarding system including labels produced in accordance with the method.

The present invention relates more specifically to a novel method of producing labels equipped with electrical oscillating circuits, such as labels used in specific applications of a great variety of branches of industry. Such labels incorporating oscillating circuits are used, for example, for monitoring and recognizing moving objects while possibly emitted signals serve for triggering of further method steps. A specific application of such labels is to be found in so-called article controlling and safeguarding system.

A decisive matter regarding such applications is that such oscillating circuits can be obtained at low costs and further and still more important, that they incorporate a high stability of the frequency and quality of the coils in order to avoid erroneous detections with a high probability.

2. Description of the Prior Art

Such labels having oscillating circuits are currently widely used. They are produced by many different methods. Generally, the starting material is a carrier made of an electrically non-conductive material while a conductive foil is placed on its front as well as on its reverse side. The desired conductors for the forming of the inductive and the capacitive elements are then formed out of these foils. This is made generally by specific etching methods, but other methods have, however, also been suggested, such as stamping or punching or use of laser rays.

It has been mentioned above that a broad application of such labels incorporating oscillating circuits is possible only if they can be manufactured with a maximal precision, and also at low costs. The necessary series production of such articles has hitherto met with large obstacles, specifically with regard to the demands of precision.

SUMMARY OF THE INVENTION

It is, therefore, an object of the present invention to provide a novel manufacturing method which allows by using common starting materials an economical series production of such labels having oscillating circuits without having to suffer regarding the precision thereof.

A further object is to provide a method of producing such labels comprising the steps of depositing a heat-sealing adhesive onto the one side of a web of an electrically conductive material and of forming from a center area of said web including said adhesive the part of the circuit to be located thereat, including the one surface of the capacitive element of each label; of thereafter depositing continuously a web of an electrically insulating material onto the side of this formed center area provided with said adhesive, and bonding said web to the electrically conducting parts of said center area of the electrically conducting web; of forming thereafter the parts of the circuit of every label, which are to be located at the outer areas of the conducting web; of covering the entire web at the opposite surface of the web with an insulating material by means of a covering foil and bonding the web to said foil after the forming of the part of the circuit located in said central area, at the latest, however, after the forming of the outer parts of the circuit; and of finally placing the parts of the circuit to be located at the rear side of said insulating material web, specifically the counter surface of the capacitive element of electrically conducting material for each label, onto the insulating material web and connecting such electrically to the parts of the circuit located at the front side.

A further object is to provide a method comprising the step of forming the rear side circuit parts consecutively out of a further web of an electrically conducting material, e.g. out of an aluminium web and of placing them in accordance with a desired pattern onto the web of an insulating material.

Still a further object is to provide a method in which simultaneously two parallel extending rows of labels are produced on the same web of an electrically conductive material, which two rows are preferably arranged in a mirror image arrangement, in which further the center area of said web is equipped with parts of the circuit of the adjacently located labels whilst the other areas of the web are equipped with the parts of the circuit supplementing the circuits of each label.

Yet a further object is to provide a method in which the web of an electrically conductive material comprises an aluminium web having a thickness of e.g. 50 μm.

A further object is to provide a method in which the web of an electrically insulating material comprises a polypropylene web, which can be covered by an adherance promoting material, e.g. PVDC.

A further object is to provide a method in which the covering foil is a insulating coating paper.

Still a further object is to provide a method in which the various parts of the circuit are formed out of conducting materials by means of punching.

Yet a further object is to provide a method comprising the step of finally checking the frequency stability of the individual oscillating circuits during which the actual electrical values are determined and compared with the design values, and in case of non-acceptable deviations from the design values, of either making the necessary adjustments by working the existing circuit parts over, specifically of the condenser surface located at the reverse side, or of removing the corresponding labels.

BRIEF DESCRIPTION OF THE DRAWINGS

The invention will be better understood and objects other than those set forth above will become apparent when consideration is given to the following detailed

DESCRIPTION OF THE PREFERRED EMBODIMENT

According to the exemplary embodiment of a method according to the invention as described herein, the labels incorporating the respective oscillating circuits shall be produced by a punching procedure. The base material of the labels is here aluminium. It shall be noted that in spite of the fact that copper has a better electrical conductivity aluminium is preferred for cost reasons. The roughly three times higher specific weight of copper would render the label accordingly more expensive although one kilogram copper is only a little more expensive than that of aluminium. The conductivity of copper which is about 30 per cent better than that of aluminium would allow a saving on material. However, it is not sufficient regarding the balance of the overall costs. In case of a specific need, for instance for special applications, it would by all means be possible to use copper instead of aluminium, in which case the corresponding increased cost of the raw material would be passed on in the final selling price.

Based on the apparatus which is illustrated schematically in FIGS. 1 and 2 the procedure of the method of production will now be explained in more detail. An aluminium web 1 is drawn off a roll $R_1$ and provided by means of an apparatus $L_1$ with a layer of a heat sealing adhesive 2.

The aluminium web 1 has for instance a thickness of 50 $\mu$m. The heat-sealing adhesive, e.g. heat-sealing lacquer, is an adhesive which sets prior to the bonding and is bonded to the opposite side upon exertion of a high pressure and a simultaneous short application of heat.

Figure 6:
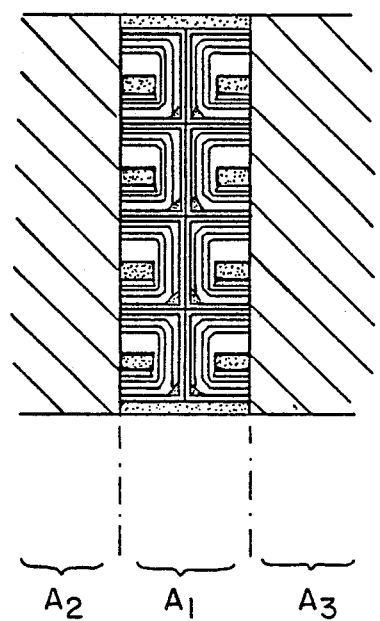
FIGS. 6 and 7 finally schematically represent a cutout of a label web after two of the most important punching steps.
Figure 7:
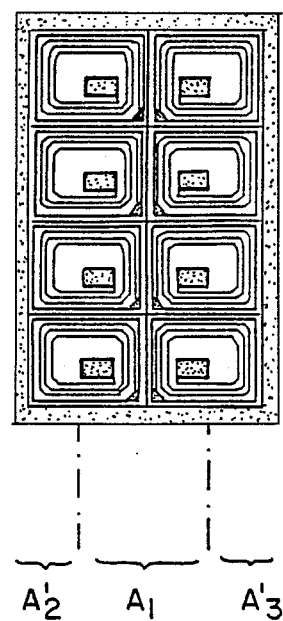

Thereafter, the aluminium web 1, covered by the heat-sealing adhesive 2 is led through a first punching apparatus $S_1$, in which in the center area $A_1$ (see FIG. 6) a first part of the inductive elements, i.e. of the coils of subsequently located labels, is punched out. In the illustrated example (FIG. 6) two parallel extending rows of labels are produced simultaneously on the same aluminium web. The two rows are thereby located in a mirror like arrangement such that the center area $A_1$ can be provided with circuit parts of the adjacently located labels, and specifically during one punching step. In the drawing, specifically in FIGS. 6 and 7 the bright area indicate the parts punched out of the aluminium web 1 while the dark areas consist of aluminium and are connected all to the base or starting web.

Following the punching step in the punching apparatus $S_1$ the aluminium web 1 having the layer of a heat-sealing adhesive 2 moves through two calibrating rolls 10, 11 and at the same time a web 3 consisting of an insulating material is fed via the upper calibrating roll 11, which web 3 is placed onto the center area $A_1$ of the side of the aluminium web 1 that includes the heat-sealing adhesive covering layer and is bonded to the conduits which have already been punched out at that area. The bonding is accomplished between the two rolls 10 and 11, which, in order to activate the adhesive may be additionally heated. Due to the placing of the insulating material web onto the parts of the coils present in the area $A_1$ the stability of shape of the punched out parts is safeguarded. The stability of the shape of the parts of the coils of the individual labels before the placing of the non-conductive web 3 is maintained because only a small part of the coils has been pre-punched, which additionally, are directly connected to the outer areas $A_2$ and $A_3$ of the aluminium web.

The web 3 of a non-conductive material which at the same time shall act at the one hand as the dielectric for the condenser, which still is to be produced, and at the other hand shall act as stabilizer for the punched coils, consists preferably of a plastic foil having predetermined electrical properties in the corresponding frequency range, for instance of a polypropylene foil. This foil is more expensive, indeed, than such made of polyethylene, however, it has a considerably higher rupture strength and accordingly stability of shape, and better electrical properties as well. These properties allow the use of a relatively thin foil, for instance 9 to 15 $\mu$m, which again reduces at the one hand the costs and at the other hand may lead specifically to smaller condensers (the larger "hole" left in the center of the spiral allows a better detection). Furthermore, the coil has a higher shape stability, which leads to a more narrow frequency tolerance.

The depositing of the heat-sealing adhesive does not only allow the fixed bonding of the plastic foil or web 3, it also prevents a so-called build-up cutting during the punching, because a sort of a lubricating of the punching tool is achieved therewith.

The aluminium web 2 punched out in the center area $A_1$ and stabilized by the insulating web 3 is led thereafter through a second punching apparatus $S_2$, in which the parts of the electrical circuit to be located in the outer areas $A_2$ and $A_3$ are punched. Because the center area $A_1$ is stabilized by the plastic foil bonded thereupon, the parts located in the outer areas $A_2$ and $A_3$ are also stable.

Following this second punching step a covering foil of an insulating material, e.g. of a covering paper 4 is applied or laminated onto the lower side of the aluminium web 1 and bonded thereto. In this way the partly produced labels are completely stabilized for the further production steps.

Now, at this stage of the method the label web consists of a lowermost cover paper layer 4, thereupon the aluminium web 1, thereafter the heat-sealing layer 2 and thereabove the insulating foil 3.

Figure 2:
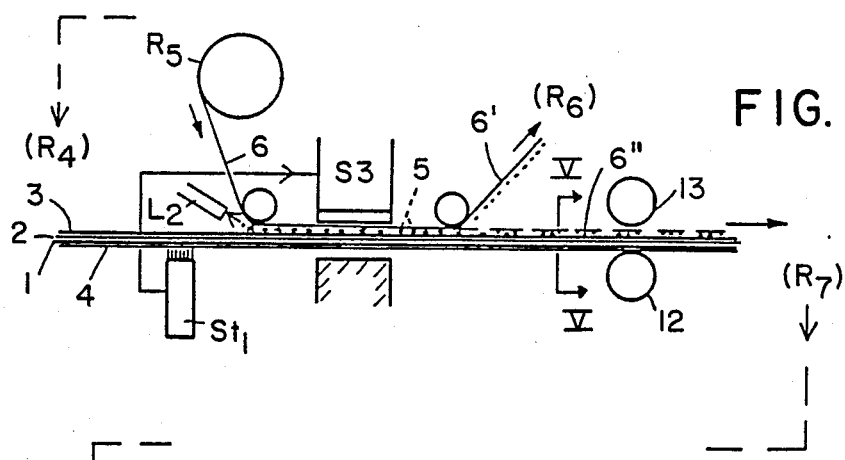

As is illustrated in FIG. 2, this web is now led to a further station in which the second part of the condenser is placed on every label and connected electrically to the coil located at the other side of the insulating material. To this end, possibly by means of the device $L_2$ a further adhesive is deposited on the upper side of the insulating material web 3. The rear surface of the condenser, and if necessary conduits connected thereto, are punched out of a further aluminium web 6, which is pulled off a roll $R_5$ in a further punching apparatus $S_3$ and placed pattern-wise, i.e. according to the design pattern, onto the web 3 of insulating material. The unused parts of the aluminium web are led away is web 6'.

Obviously, suitable controllers St provide for the correct controlling of the punching apparatus S₃ and the correct positioning of the other condenser surface on the insulating web 3, i.e. of the surface area covering placing of these parts of the condenser being placed on the reverse side over the condenser surface in the previously produced part of the circuit.

In order to bond the parts of the circuit on the reverse side a further adhesive is used as explained above, which obviously can be deposited onto the lower side of the aluminium web 6 instead onto the non-conductive foil 3. A heat-sealing adhesive can be used for this purpose also. Because, however, it is quite difficult to heat the precise punching tools used here, it is possible to provisionally attach the second surface part of the condenser and the corresponding parts of the circuit initially onto the non-conductive foil, which may be accomplished for instance by super-sonic probes. The heatsealing operation for the rear side circuit parts to the non-conductive foil 3 can be accomplished later between two heated laminating rolls 12 and 13.

Now, the label web as such is finally produced. If desired, the individual labels may be separated from each other or can be packed in the form of large webs.

The labels incorporating the oscillating circuits are preferably examined regarding the stability of the frequency. A process calculator compares the design frequency with the actual frequency, and depending upon the set tolerance values and deviations of the actual values a further punching apparatus S₄ (FIG. 3) is controlling operated which decreases correspondingly the surface area of the condenser area. In order to decrease the condenser, only the backside part of the condenser is punched.

Figure 3:
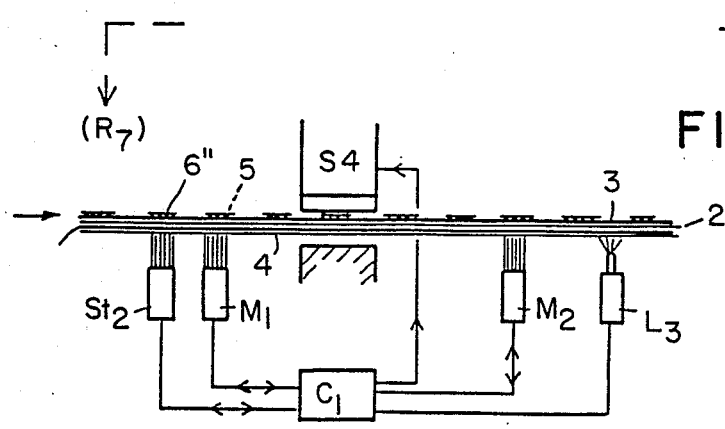

FIG. 3 of the drawing illustrates schematically how the label webs are controlled by means of the devices St₂ and M₁ for the measuring of the frequency, whereby the comparison is made via the calculator C₁ and if necessary the punching apparatus S₄ for the correcting of the condenser is provided with corresponding control signals. A verifying measuring may proceed by the device M₂, whereafter bad labels are marked for instance by the device L₃. Quite obviously other correction procedures can be used.

Thereafter, the finally produced and checked labels are packed and forwarded to their final user.

Figure 1:
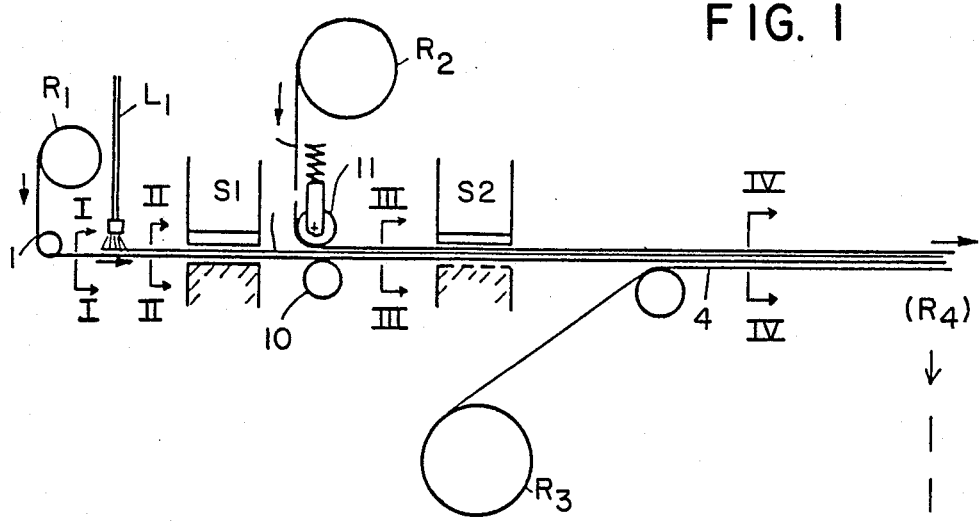
FIG. 1-3 illustrate schematically an apparatus on which the various consecutive steps of the production method can be carried out.
Figure 4:
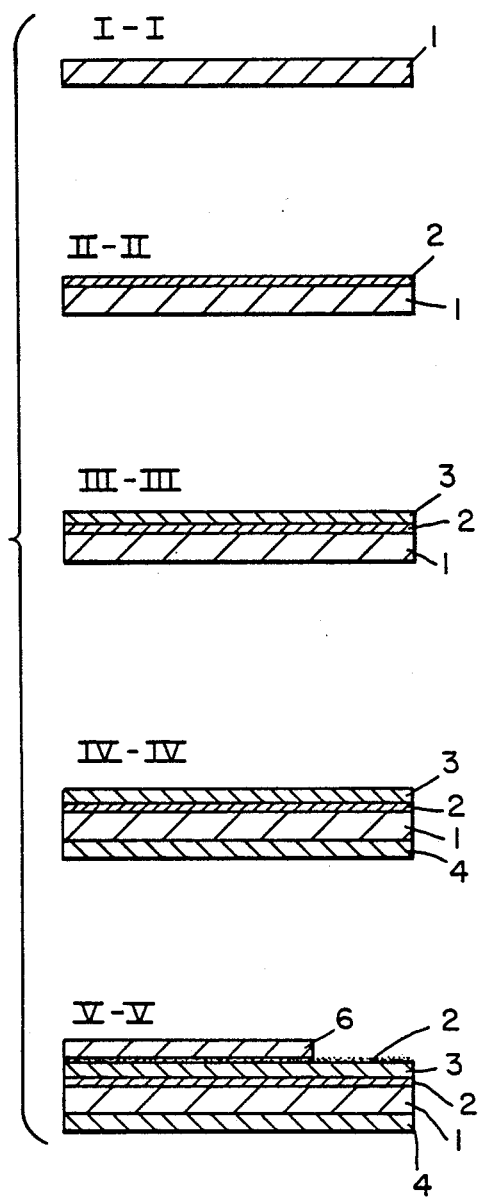
FIG. 4 illustrates on an enlarged scale various sectional views of the indicated areas of section through the label web, whereby the various material layers are shown at the indicated areas.

FIG. 4 of the drawing illustrates, on a schematic basis only and on an enlarged scale at the indicated section areas of FIGS. 1 to 3, the structure of the various layers of the label web at the various sections.

Figure 5:
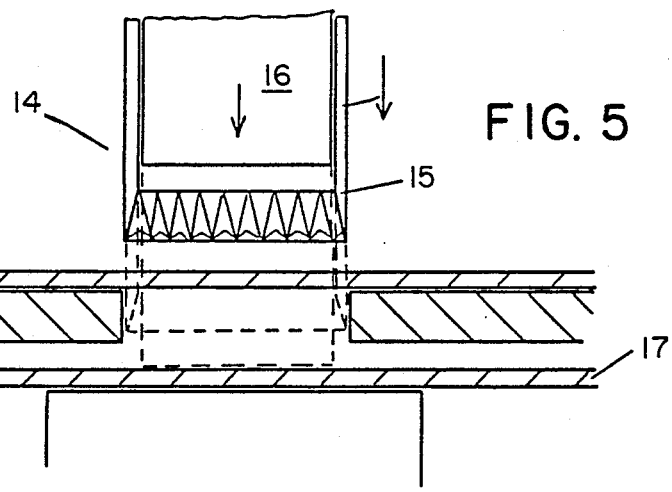
FIG. 5 schematically shows a punching apparatus which may be used at various stations of the apparatus for practicing the present invention.

FIG. 5 of the drawing illustrates finally a purely schematic embodiment of a punching apparatus 14 in which by means of the punching tools 15 the punchings are made while the removed parts are either pushed away by the punch 16 or the parts which have been punched out (e.g. punching apparatus 3) are pressed onto the web 17 located thereunder.

While there is shown and described a present preferred embodiment of the invention, it is to be distinctly understood that the invention is not limited thereto, but may be otherwise variously embodied and practiced within the scope of the following claims.

I claim:

1. A method of producing a plurality of oscillatory circuits located consecutively on a web, each circuit including a respective inductive element and at least one capacitive element having at least two surfaces, thus forming the oscillatory circuit, and including further an insulating support web having two faces, on a first face of which said inductive element formed of flat electrical conductors and one surface of said capacitive element connected thereto are located according to a predetermined pattern, while a second surface of said capacitive element is located on a second face of said insulating support and is electrically connected to the circuit at the first face, comprising the following steps:
   providing a web of electrically conductive material;
   depositing a heat-sealing adhesive onto a first face of the web of electrically conductive material;
   punching at a center area of said conductive web including said adhesive one portion of a first circuit part to be located thereat, including one surface of a capacitive element;
   thereafter depositing continuously a substantially electrically non-conductive web of an electrically insulating material onto the side of the punched center area provided with said adhesive and bonding said substantially electrically non-conductive web to an electrically conductive part of said center area of the electrically conductive web;
   punching at an outer area of the conductive web adjacent to the center area another portion of the first circuit part to be located on the conductive web;
   covering the entire conductive web at the face opposite from the substantially electrically non-conductive web with a covering foil of substantially electrically non-conductive material and bonding the conductive web to said foil after punching the first circuit part located on the conductive web; and
   placing a second circuit part to be located at an outwardly facing side of said substantially electrically non-conductive web, said second circuit part including a counter surface of the capacitive element of electrically conducting material for each circuit, and connecting said second circuit part electrically to the first circuit part located at the first face of the electrically conductive web.

2. The method of claim 1, comprising the additional steps of: providing a second web of electrically conductive material; forming additional circuit parts consecutively in said second web, and placing the additional circuit parts patternwise onto said substantially electrically non-conductive web in predetermined relationship to the first circuit parts.

3. The method of claim 1, wherein two parallel extending rows of circuits are simultaneously produced on the same web of an electrically conductive material, the two rows positioned in a mirror image arrangement, wherein the center area of said conductive web includes parts of adjacently locate circuits, and wherein outer areas of the web include additional parts of the circuits.

4. The method of claim 1, in which said web of electrically conductive material includes an aluminum web having a thickness of about 50 $\mu$m.

5. The method of claim 1, in which said web of substantially electrically non-conductive material is a polyvolefin web having a thickness of from about 9 to about 15 $\mu$m and is covered by a layer of an adhesion promoting material.

6. The method of claim 1, in which the covering foil is an insulating coating paper.

7. The method of claim 1, wherein the second circuit parts are in the form of an aluminum web.

8. The method of claim 1, including the additional step of checking the frequency stability of the individual oscillating circuits by determining actual electrical values and comparing those values with design values, and making necessary adjustments to the actual electrical values by changing the surface area of the capacitive element counter surface.

9. The method of claim 8, in which said adjustments are made by stamping.

10. A method for producing electrical circuits in the form of flat sheets having capacitive and inductive circuit elements, said method comprising:
   a. providing a web of electrically conductive material, said web having a first face and a second face;
   b. applying an adhesive layer to the first face of said conductive web;
   c. punching a first circuit portion by removing part of the material defining a center portion of said conductive web;
   d. applying a web of substantially electrically non-conductive material over the formed first circuit portion and in contact with the adhesive layer;
   e. punching a second circuit portion in the conductive web in an area laterally outwardly of and adjacent to the first circuit portion to form a circuit element;
   f. applying a layer of insulating material to the second face of the web of electrically conductive material.

11. A method in accordance with claim 10, including the additional steps of:
   g. applying an electrically conductive material in overlying relationship with the first surface of the web of electrically conductive material and in adherent relationship with the substantially electrically non-conductive material;
   h. punching a further circuit element in the second electrically conductive material; and
   i. removing excess conductive material after the further electrical element has been formed.

12. A method in accordance with claim 11, including the additional steps of:
   j. measuring the electrical characteristics of the circuit; and
   k. reforming the additional circuit elements as needed to provide corrected circuit elements having desired electrical performance.

13. A method in accordance with claim 11, including the additional steps of:
   l. checking the electrical performance of corrected circuit elements; and
   m. ejecting corrected circuit elements that do not meet predetermined electrical performance conditions.

* * * * *